United States Patent [19]

Kannam et al.

[11] 4,017,882

[45] Apr. 12, 1977

[54] TRANSISTOR HAVING INTEGRATED PROTECTION

[75] Inventors: Peter Joseph Kannam, Princeton; Wilfred Potter Bennett, Belle Mead, both of N.J.

[73] Assignee: RCA Corporation, New York, N.Y.

[22] Filed: Dec. 15, 1975

[21] Appl. No.: 641,138

[52] U.S. Cl. .................................. 357/13; 357/34; 357/37; 357/48; 307/303

[51] Int. Cl.$^2$ ................. H01L 29/90; H01L 29/72; H01L 29/00; H01L 27/04

[58] Field of Search ................ 357/13, 34, 38, 35, 357/37, 48; 307/302, 303

[56] References Cited

UNITED STATES PATENTS

| | | | |
|---|---|---|---|
| 3,633,052 | 1/1972 | Hanna | 357/13 |
| 3,677,838 | 7/1972 | Brebisson | 357/13 |
| 3,758,831 | 9/1973 | Clark | 357/13 |
| 3,881,179 | 4/1975 | Howard | 357/13 |
| 3,921,199 | 11/1975 | Yuan et al. | 357/13 |
| 3,936,863 | 2/1976 | Olmstead | 357/13 |

FOREIGN PATENTS OR APPLICATIONS

| | | | |
|---|---|---|---|
| 1,073,560 | 6/1967 | United Kingdom | 357/38 |

*Primary Examiner*—Andrew J. James
*Attorney, Agent, or Firm*—H. Christoffersen; R. P. Williams; R. A. Hays

[57] ABSTRACT

An integrated transistor device has reverse bias breakdown protection for both the base-collector PN junction and the base-emitter PN junction. The base-emitter PN junction is protected by means of a diode effectively in parallel relation therewith, and the base-collector PN junction is protected by means of a protective region which provides a punch-through mode of operation.

8 Claims, 3 Drawing Figures

TRANSISTOR HAVING INTEGRATED PROTECTION

The present invention relates to semiconductor devices in general and in particular to transistors having protection against excessive reverse bias voltages.

Transistors may be severely damaged, if not catastrophically destroyed by the application of a excessive reverse bias voltage across either the base-collector PN junction or the base-emitter PN junction. The base-emitter PN junction is particularly susceptible to damage when a transistor is switched while inductively loaded. For example, normally a transistor operates with the base-emitted PN junction forward biased and the base-collector PN junction reverse biased. In this mode of operation, current flows from the emitter region through the base region and into the collector region. Any transient or abrupt voltage surge which causes the base-collector PN junction to become more reverse biased may cause this junction to avalanche and thereby damage the transistor. Further, when an inductively loaded transistor is switched off, that is when the base-emitter PN junction becomes reverse biased, the current in the inductive load, during the short time it discharges, continues to flow in the same direction, i.e., into the emitter region. Under these circumstances, with the base-emitter PN junction reverse biased, considerable heat can be generated in the emitter region which may also cause damage to the device.

One known solution to the problem of excessive reverse bias voltage across the base-collector PN junction is described below. Generally, avalanche breakdown can be avoided by providing the transistor with an auxiliary emitter, the auxiliary emitter being electrically shorted to the base region by a deposited metal electrode. Under reverse bias conditions, the base-collector PN junction depletes into the auxiliary emitter region thus giving rise to a punch-through condition in which current flows from the collector through the auxiliary emitter, through the base contact and into the base region, thus discharging the reverse current through the device. The auxiliary emitter is designed such that punch-through occurs prior to the base-collector PN junction avalanching, thereby preventing damage to this junction.

This solution exhibits a number of problems. One problem is that the device is incapable of handling relatively large amounts of energy because of the relatively small size of the auxiliary emitter. Another problem is that the base contact, which overlies the base region and the auxiliary emitter of opposite conductivity type and the PN junction therebetween, creates a reliability problem. The problem is that during formation of the base contact it is a distinct possibility that the metal contact will spike through the junction into a portion of the base region. When this spiking occurs, this portion of the base region is disrupted and does not operate in a predictable manner. Spiking can also occur during the operation of the completed device. Therefore, the operation of the transistor is unreliable.

The conventional solution of the problem of base-emitter PN junction breakdown is to externally connect a diode between the emitter and collector leads. This solution is disadvantageous because it increases the cost of any system in which this protection is used.

Figure 1:
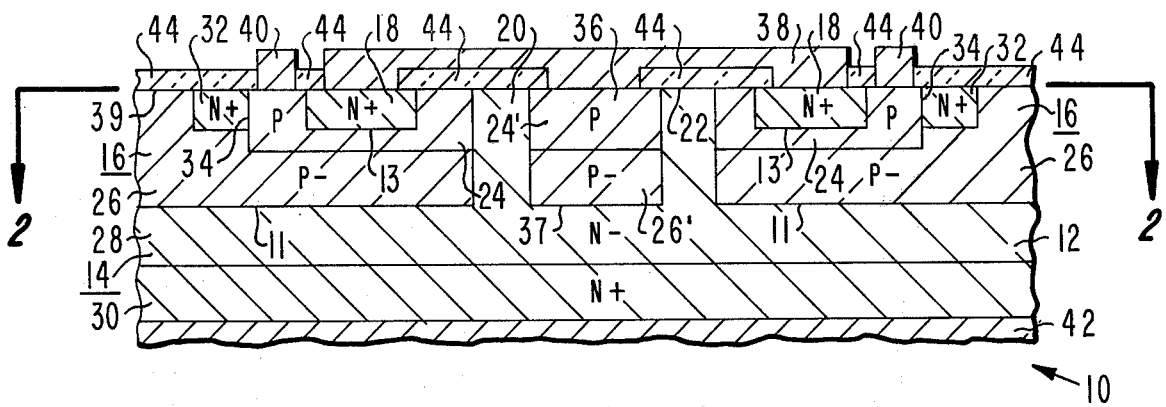
FIG. 1 is a partial cross-sectional view of one embodiment of the present device, not drawn to scale.
Figure 2:
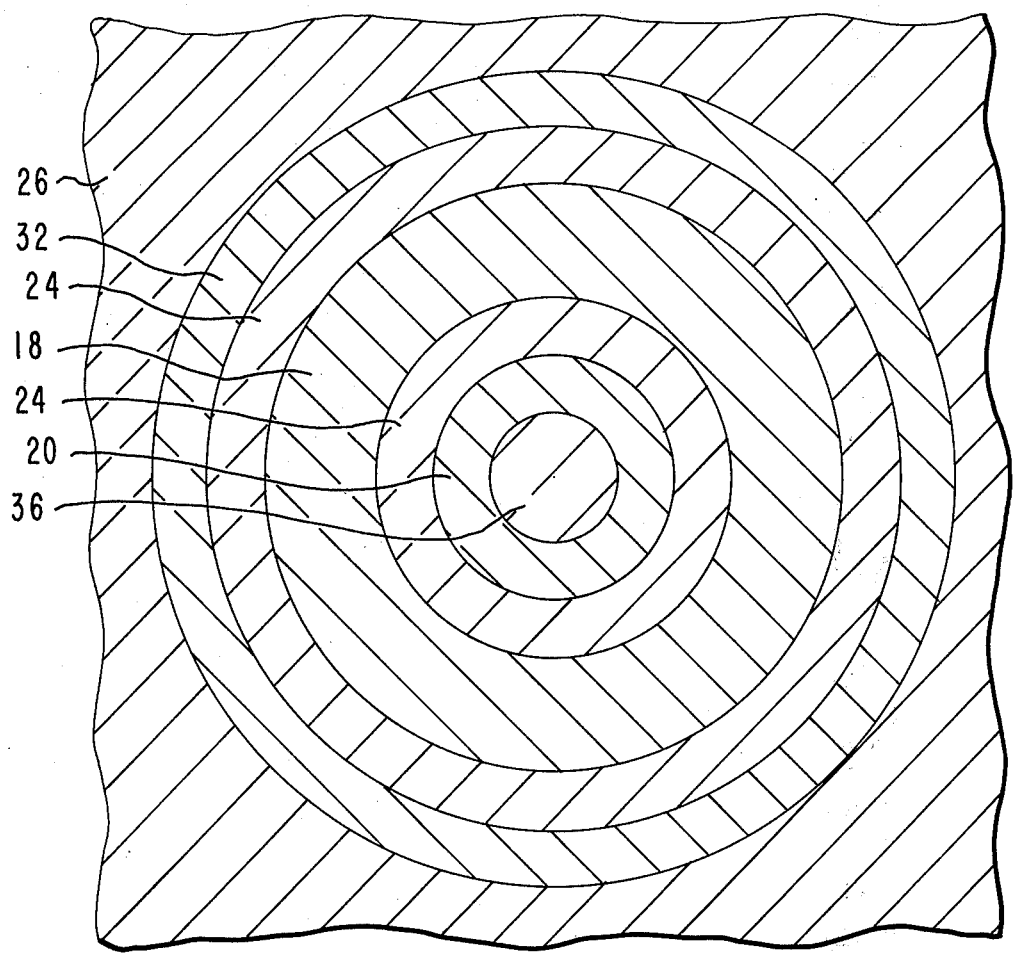
FIG. 2 is a partial sectional view of the present device taken along the line 2—2 of FIG. 1 showing the various regions therein, not drawn to scale.

One embodiment of the present device, indicated generally at 10 in FIGS. 1 and 2, comprises a body 12 of semiconductor material, for example, silicon, in which is disposed a transistor and means for protecting the two PN junctions 11 and 13 thereof against damage caused by excessive reverse bias voltages.

The transistor 10 comprises a collector region 14, in this embodiment of N type conductivity, a base region 16 of P type conductivity, and an emitter region 18 of N type conductivity. In this embodiment, the base region 16 is annular and surrounds a central core 20 of the collector region 14 which extends to the upper surface 22 of the body 12. For a reason described hereinafter, the base region 16 comprises a first layer 24 of comparatively low average resistivity, for example about 0.03 ohm-centimeter, and a second layer 26 of comparatively high average resistivity, for example about 30 ohm-centimeter. Also, for reasons known in the art, the collector region 14 comprises a first layer 28 of comparatively high average resistivity, for example about 30 ohm-centimeter, and a second layer 30 of comparatively low average resistivity, for example about 0.03 ohm-centimeter. By virtue of the comparatively high resistivities of the two layers 26 and 28 adjoining the PN junction 11 between the collector region 14 and the base region 16, the avalanche breakdown voltage of this junction 11 is comparatively high, e.g., about 700V.

Base-collector PN junction protection means comprises a first protective region 32 of comparatively low N type average resistivity material, for example about 0.03 ohm-centimeter, contacting and surrounding the annular first layer 24 of the base region 16 and forming a first PN junction 34 therewith. For reasons of ease of fabrication, the conductivity profile and depth of the first protective region 32 can be the same as those of the emitter region 18, whereby both regions, 32 and 18 respectively, can be simultaneously formed by, for example, a single diffusion step.

Base-emitter PN junction protection means for the transistor 10 comprises, in the one-embodiment, a second protective region 36 of P type conductivity disposed within the core 20 of the collector region 14. The region 36 forms a PN junction 37 with the collector region 14 in parallel relation with the PN junction 13 between the emitter region 18 and the base region 16 of the transistor. For reasons of each of fabrication, the second protective region 36 can have the same conductivity profile and depth as that of the base region 16, i.e., it can contain two layers 24' and 26' similar to the regions 24 and 26 of the base region 16. Thus, both regions 36 and 16 can be formed simultaneously with one another.

Electrodes for the device 10 comprise an emitter electrode 38 contacting, in the embodiment of FIG. 1, both the emitter region 18 and the protective region 36 where these regions reach the upper surface 22 of the body. A base electrode 40 contacts the more highly conductive layer 24 of the P base region 16, and a collector electrode 42 contacts the collector region 14. As shown, and in accordance with conventional practices, an insulating layer 44, for example silicon dioxide, or the like is provided on the surface 22 of the body 12 to protect it and prevent shorting of the various PN junctions by the electrodes where the PN junctions intercept the surface 22.

Figure 3:
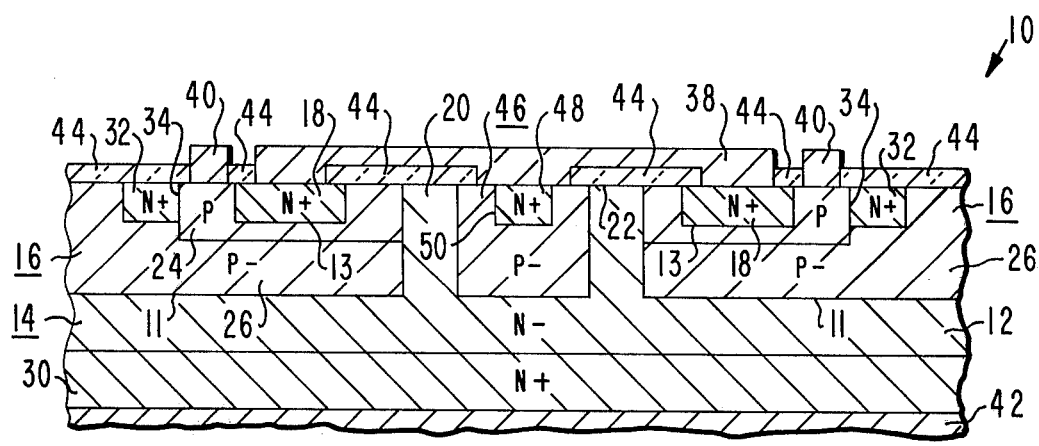
FIG. 3 is a partial cross-sectional view of another embodiment of the present device, not drawn to scale.

In another embodiment, shown in FIG. 3, wherein features similar to those of the present device as shown in FIG. 1 are designated by the same reference numerals, base-emitter PN junction protection means again comprises a diode in parallel relation with the PN junction 13. Herein, however, the diode comprises a third protective region 46 of P type conductivity disposed within the core 20 of the collector region 14 and a fourth protective region 48 of N type conductivity disposed within the third protective region 46 and forming a second PN junction 50 therewith. For reasons of ease of fabrication the third protective region 46 can have the same conductivity profile and depth as the second layer 26 of the base region 16 and the fourth protective region 48 can have the same conductivity profile and depth as the emitter region 18. In the embodiment of FIG. 3, the emitter electrode 38 also contacts the fourth protective region 48 and part of the third protective region 46 where it reaches the surface 22 of the body 12.

One condition of potential damage to the transistor 10 is when the base-collector PN junction 11 is operated in a reverse bias condition.

Under reverse bias voltage conditions the base-collector PN junction 11 forms a depletion region which extends into the second layer 26 of the base region 16 and the first layer 28 of the collector region 14. For reasons known in the semiconductor art, a PN junction, having a given reverse bias voltage thereacross, depletes further into semiconductor material having higher average resistivity than into material having lower average resistivity. Therefore, because the protective region 32 is disposed within the second layer 24 of comparatively higher average resistivity and the emitter region 18 is disposed within the first layer 24 of comparatively lower average resistivity, the depletion region associated with the reverse biased junction 11 reaches, i.e., punches through, the protective region 32 at a comparatively low base-collector PN junction voltage and before avalanching of the PN junction 11 occurs. Because of the relatively low resistivities of the first layer 24 of the base region 16 and the protective region 32, the first PN junction 34 therebetween substantially immediately avalanches, whereby current flows into the emitter region 18. Because of the surrounding relation between the protective region 32 and the first layer 24 of the base region 16, the first PN junction 34 breaks down substantially simultaneously all the way around the first layer 24 and the current flows substantially equally distributed into the emitter region 18. Hence, this structure avoids hot spots caused by current crowding as the current is discharged through the device 10 by a combination of punch-through and avalanche breakdown modes. This has the advantages of: (a) the base-collector PN junction voltage does not build up to the point where that junction avalanches and (b) the need for a shorting electrode between the base region 16 and the auxiliary emitter 32 is eliminated. The conductivity profile and depth of the protective region 32 and the conductivity profile and depth of the first layer 24 of the base region 16 can be adjusted, using known techniques, to insure that the punch-through and avalanching of the protective region 32 occurs prior to any avalanching of the base-collector PN junction 11.

Another condition of potential damage is when the base-emitter PN junction 13 is reverse biased. One particular condition of potential danger is when the device is inductively loaded. Under this condition, when the base-emitter PN junction 13 switches from a forward biased state to a reverse biased state the inductive current will continue to flow into the emitter region 18 until the stored inductive current is dissipated. During this discharging time, since the inductive current cannot flow across the base-emitter PN junction 13, considerable heat is generated in the emitter region 18 which can cause damage thereto. Because of the relatively low average resistivities of the emitter region 18 and the first layer 24 of the base region 16 the base-emitter PN junction 13 has a comparatively lower breakdown voltage than the base-collector PN junction 11. When current flows into the emitter region 18, as in the switching off of an inductive load for example, when the base-emitter PN junction 13 is reverse biased, the PN junction 13 can avalanche due to an excessive turn-off voltage. The protective diode 37 which is forward biased when the base-emitter PN junction 13 is reverse biased prevents the base-emitter PN junction 13 from avalanching. The protective diode 37 has a relatively lower forward conduction voltage than the reverse bias breakdown voltage of the base-emitter PN junction 13. Therefore, before the base-emitter PN junction 13 avalanches, the protective diode 37 conducts and thereby provides a path for the inductor current to discharge without damage to the base-emitter PN junction 13. The amount of current that can be passed through the protective diode 37 is dependent upon the diode area.

In addition to the above described forward biased diode protection for the base-emitter PN junction 13, the device 10 shown in FIG. 3 also provides additional protection for a reverse biased base-collector PN junction 11 via the region 48. When the base-collector PN junction 11 is reverse biased, the third protective region 46 and the fourth protective region 48 operate in the same manner as the lower layer 26 of the base region 16 and the first protective region 32.

The device 10, as described above, avoids the use of a short between the first layer 24 of the base region 16 and the protective region 32 and therefore the PN junction 34 therebetween is quite reliable. The device 10 additionally provides, as described above, integrated protection against damage from excessive reverse bias voltages across the base-emitter PN junction 11.

Furthermore, since the protective regions, 36 and 46, are substantially completely isolated from the transistor, by the surrounding material of the core 20, a shunt resistance across the base-emitter PN junction 13 is avoided. Hence the leakage current across the base-emitter PN junction 13 is small and the device 10 is thereby more reliable.

What is claimed is:

1. An integrated transistor having a base region of a one type conductivity, a collector region of a second type conductivity adjacent to said base region and forming a base-collector PN junction at the interface therewith, an emitter region of said second type conductivity adjacent said base region and forming a base-emitter PN junction at the interface therewith, said transistor comprising:

a first protective region having said second type conductivity contacting and surrounding said base region and forming a first PN junction therewith; and a second protective region having said one type conductivity adjacent said collector region and forming a PN diode therewith.

2. An integrated transistor as claimed in claim 1 wherein:

said PN diode is in parallel relation with said base-emitter PN junction, said diode being poled to be forward biased when said emitter PN junction is reverse biased.

3. An integrated transistor as claimed in claim 1 wherein:

said first protective region has a doping profile and depth which is substantially the same as said emitter region; and said second protective region has a doping profile and depth which is substantially the same as said base region.

4. An integrated transistor as claimed in claim 1 wherein:

said base region comprises a layer of comparatively low resistivity and a layer of comparatively high resistivity;

said collector region comprises a layer of comparatively high resistivity and a layer of comparatively low resistivity; and said first protective region surrounds said layer of comparatively low resistivity of said base region.

5. An integrated transistor as claimed in claim 4 wherein:

said first protective region and said layer of comparatively low resistivity of said base region have relative conductivities such that said first PN junction avalanches at a lower voltage than said base-collector PN junction of said device.

6. An integrated transistor as claimed in claim 1 wherein:

said base region and said emitter region are annular and surround a core of said collector region.

7. An integrated transistor as claimed in claim 6 wherein:

said second protective region is within said core.

8. An integrated transistor as claimed in claim 7 further comprising:

base-collector PN junction protection means within said core.

* * * * *